(12) United States Patent
Tsao

(10) Patent No.: US 6,288,451 B1
(45) Date of Patent: Sep. 11, 2001

(54) FLIP-CHIP PACKAGE UTILIZING A PRINTED CIRCUIT BOARD HAVING A ROUGHENED SURFACE FOR INCREASING BOND STRENGTH

(75) Inventor: Pei-Haw Tsao, Taichung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/103,918

(22) Filed: Jun. 24, 1998

(51) Int. Cl.[7] .................................................. H01L 23/48
(52) U.S. Cl. ........................ 257/778; 257/738; 257/780; 257/782; 361/719; 361/720; 361/792
(58) Field of Search ...................... 257/737, 738, 257/777, 778, 779, 780, 686, 782; 438/106, 107, 108, 118, 119; 361/719, 720, 792, 807, 809, 810

(56) References Cited

U.S. PATENT DOCUMENTS

| | | | |
|---|---|---|---|
| 5,121,299 | * | 6/1992 | Frankeny et al. ..................... 361/413 |
| 5,386,341 | * | 1/1995 | Olson et al. .......................... 361/749 |
| 5,535,526 | * | 7/1996 | White ........................................ 34/78 |
| 5,592,736 | * | 1/1997 | Akram et al. ........................... 29/842 |
| 5,834,848 | * | 11/1998 | Iwasaki .................................. 257/778 |
| 6,208,525 | * | 3/2001 | Imasu et al. ........................... 361/783 |

FOREIGN PATENT DOCUMENTS

| | | | |
|---|---|---|---|
| 400177 | * | 12/1990 | (EP) . |
| 52-38885 | * | 3/1977 | (JP) . |
| 1-192124 | * | 8/1989 | (JP) . |
| 3-105924 | * | 5/1991 | (JP) . |

* cited by examiner

Primary Examiner—Olik Chaudhuri
Assistant Examiner—Alonzo Chambliss
(74) Attorney, Agent, or Firm—Tung & Associates

(57) ABSTRACT

An integrated circuit chip package which has improved bond strength formed between an IC die and a printed circuit board or an interposer is provided. The improved bond strength is achieved by providing a roughened surface on the printed circuit board or the interposer such that a mechanical interlocking effect is achieved between the IC die and the PCB or the interposer. The roughened surface can be provided by a multiplicity of recesses in a top surface of the PCB or the interposer such as a multiplicity of dimples or surface grooves provided by either a chemical etching method or a mechanical abrasion method. The depth of the multiplicity of recesses should be such that a desirable mechanical interlocking effect is achieved between the components to be bonded together in the IC package.

17 Claims, 1 Drawing Sheet

FLIP-CHIP PACKAGE UTILIZING A PRINTED CIRCUIT BOARD HAVING A ROUGHENED SURFACE FOR INCREASING BOND STRENGTH

FIELD OF THE INVENTION

The present invention generally relates to a method for bonding a semiconductor chip to a printed circuit board and a package formed by such method and more particularly, relates to a method for bonding a chip to a printed circuit or an interposer by first providing a roughened surface on the board or the interposer and then filling the gap formed inbetween the solder balls situated between the chip and the board for increasing the bond strength and an electronic package formed by the method.

BACKGROUND OF THE INVENTION

In the fabrication of modern semiconductor devices, the ever increasing device density and decreasing device dimensions demand more stringent requirements in the packaging or interconnecting techniques of the devices. In recent years, a flip-chip attachment method or a flip-chip direct chip attachment (CA) method has been used in packaging integrated circuit chips. In the flip-chip attachment method, instead of attaching an integrated circuit lead frame in a package, an array of solder balls is formed on the surface of the die for the subsequent bonding to a printed circuit board of or an interposer. The formation of the solder balls can be carried out by an evaporation method utilizing a solder material consisting mainly of tin and lead through a mask to produce the balls in a desired pattern. More recently, the technique of eletrodeposition has also been used to mass produce solder balls in a flip-chip packaging process.

In the flip-hip attachment method, all the interconnections between a semiconductor chip and a printed circuit board (PCB) or an interposer can be formed simultaneously and therefore maximizing fabrication throughputs. For instance, direct chip attachment, solder bumps or solder balls are used to connect a chip directly to a printed circuit board or an interposer. In a regular printed circuit board, the density of the interconnections is not formed high enough to match that normally found on a chip surface. In other words, the pitch between the bond pads formed on a chip is smaller than the pitch formed between interconnections on a printed circuit board. An interposer is therefore used to provide a transition and to accommodate the bond pads/interconnections which are spaced differently. An interposer board is frequently fabricated of the same material as that used in the printed circuit board, i.e., an epoxy-type polymeric material. When a high density interconnect printed circuit board is utilized in a flip-chip method for bonding to a semiconductor chip, the use of the interposer may not be necessary.

The use of organic substrates, or polymeric-base substrates, in printed circuit boards or interposers introduces a new source of problem for the flip-chip bonding of a silicon chip which is significantly inorganic to such substrates. The problem is the mismatch of coefficients of thermal expansion (CTE) between the printed circuit board and the silicon chip. The coefficient of thermal expansion for the printed circuit board material is at least five times that of the silicon material. The extreme mismatch in CTE's between the silicon chip and the organic substrate of the printed circuit board therefore subjects solder joints formed therebetween to extremely large thermal strains, which leads to premature failure of the solder connections.

One method proposed for alleviating such thermal strains is the introduction of an encapsulating layer between the silicon chip and the organic substrate. The encapsulating material, known as an underfill, which is typically a silica field epoxy is used to fill the standoff between the printed circuit board and the silicon chip. Since the silicon chip is normally covered, in a final fabrication step, by a polymer passivation/stress buffer layer such as a polyimide film, the underfill forms a bond between the polyimide layer on the chip and the organic substrate of the printed circuit board encapsulating the solder joints.

While the introduction of the underfill layer between a silicon chip and an organic substrate for the printed circuit board has enhanced the thermal shock resistance of a flip-chip assembly, the organic substrate material still has a coefficient of thermal expansion at least twice that of the underfill material. The effect of the CTE mismatch on the interfacial adhesion of polyimide with underfill can be significant and unacceptable.

It is therefore an object of the present invention to provide an integrated circuit package of an IC chip bonded to a substrate made of a high CTE material that does not have the drawbacks or shortcomings of the conventional integrated circuit packages.

It is another object of the present invention to provide an integrated circuit package that has improved bond strength between an IC chip and a printed circuit board with an underfill material encapsulated thereinbetween.

It is a further object of the present invention to provide an integrated circuit package that has improved bond strength formed between an IC chip and an interposer with an underfill material thereinbetween.

It is another further object of the present invention to provide an integrated circuit package by bonding an IC chip to a surface of a printed circuit board or an interposer which is provided with a surface roughness such that the bond strength to an underfill material is improved.

It is still another object of the present invention to provide an integrated circuit package by bonding an IC chip to a printed circuit board or an interposer wherein the surface of the later is roughened by a multiplicity of dimples to achieve improved bonding with an underfill material.

It is yet another object of the present invention to provide an integrated circuit package that has improved bond strength between an IC chip and a printed circuit board or an interposer wherein the surface of the later is provided with a multiplicity of grooves to achieve improving bonding with an underfill material.

It is still another further object of the present invention to provide a method for improving bond strength in a bond form between an IC chip and a substrate by providing a substrate that has a bonding surface with a surface roughness sufficiently great such that a bond strength formed between the roughened surface and an underfill layer is improved by at least 10%.

It is yet another further object of the present invention to provide a method for improving bond strength in a bond formed between an IC chip and a substrate by providing a roughened surface to a printed circuit board or an interposer which is formed by a multiplicity of grooves.

SUMMARY OF THE INVENTION

In accordance with the present invention, an integrated circuit package which has improved bond strength between an IC chip and a printed circuit board or an interposer is provided.

In a preferred embodiment, an integrated circuit chip package is provided which includes an IC chip that has a first surface provided with a first plurality of bond pads, a substrate that has a second surface provided with a first plurality of electrical conductors for bonding to the first plurality of bond pads on the IC chip by a first plurality of spaced-apart solder balls, an underfill for filling gaps between the first plurality of spaced-apart solder balls, said first surface and said second surface wherein the second surface on the substrate has a surface roughness sufficiently great for increasing the bond strength between the first surface, the second surface and the underfill.

The surface roughness on the second surface is sufficiently great so as to increase the bond strength between the first surface and the second surface by at least 10%. The substrate can be a printed circuit board (PCB). The substrate can also be an interposer. The first plurality of electrical conductors can be traces formed by a conductive metal.

The integrated circuit chip package may further include an interposer used for the substrate, a printed circuit board that has a second plurality of electrical conductors on a third surface, a second plurality of spaced-apart solder balls for providing electrical communication between the interposer and the second plurality of electrical conductors, and an underfill filling gaps formed between the second plurality of spaced-apart solder balls, the interposer and the third surface on the printed circuit board. The surface roughness may be provided by a multiplicity of recesses formed in the second surface. The multiplicity of recesses each has a depth sufficiently large such that a mechanical interlock is formed between the multiplicity of recesses, the interposer and the second surface. The multiplicity of recesses may also be a multiplicity of dimples. The surface roughness may also be provided by a multiplicity of grooves formed in the second surface., In another preferred embodiment, an integrated circuit chip package is provided which includes an IC chip that has a first surface provided with a first plurality of bond pads, an interposer that has a second surface provided with a first plurality of electrical conductors, a first plurality of spaced-apart solder balls for electrically connecting the first plurality of bond pads to the first plurality of electrical conductors, an underfill layer for filling gaps between the first plurality of spaced-apart solder balls, the first surface and the second surface, a printed circuit board that has a second plurality of electrical conductors formed on a third surface, and a second plurality of spaced-apart solder balls electrically connecting the interposer to the second plurality of electrical conductors on the printed circuit board, wherein the second surface on the interposer is provided with a surface roughness sufficiently great to increase the bond strength between the first surface, the second surface and the underfill layer.

The surface roughness is made sufficiently great for increasing the bond strength between the first surface and the second surface by at least 10%. The surface roughness may be formed by a multiplicity of recesses in the second surface. The multiplicity of recesses may be a multiplicity of dimples, or a multiplicity of grooves. The first plurality and the second plurality of electrical conductors are traces formed by a conductive metal. The surface roughness may be formed by a chemical etching process or by a mechanical abrasion process.

The present invention is further directed to a method for improving bond strength in a bond formed between an IC chip and a substrate which may be carried out by the operating steps of first providing an IC chip that has a first plurality of bond pads formed on a first surface, then providing a substrate that has a first plurality of electrical conductors formed on a second surface, bonding the first plurality of bond pads to the first plurality of electrical conductors by a first plurality of spaced-apart solder balls, and filling a gap formed between the first plurality of solder balls, the first surface and the second surface with an underfill layer, wherein the second surface on the substrate is provided with a surface roughness sufficiently great such that the bond strength between the first surface, the second surface and the underfill layer is improved by at least 10%.

The substrate utilized in the method may be a printed circuit board or an interposer. The substrate may be an interposer and the method may further include the steps of providing a printed circuit board that has a second plurality of electrical conductors formed on a third surface, and bonding the second plurality of electrical conductors to the interposer by a second plurality of spaced-apart solder balls. The method may further include the step of providing the surface roughness in a form of recesses in the second surface. The surface roughness may be provided in a form of dimples by a chemical etching method, or in a form of surface grooves by a mechanical abrasion method. The method may further include the step of forming the first plurality of electrical conductors in traces of a conductive metal.

BRIEF DESCRIPTION OF THE DRAWINGS

These and other objects, features and advantages of the present invention will become apparent from the following detailed description and the appended drawing in which.

DETAILED DESCRIPTION OF THE PREFERRED EMBODIMENT

Figure 1:
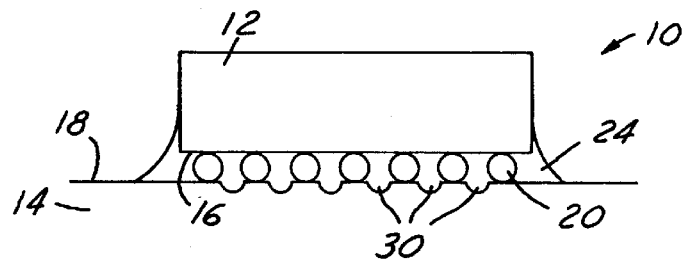
FIG. 1 is an enlarged, cross-sectional view of a present invention integrated circuit package of an IC chip bonded to a printed circuit board equipped with a roughened surface by a plurality of solder balls and an underfill layer.

The present invention discloses an integrated circuit package that has improved bond strength between an IC chip and a printed circuit board or an interposer by a plurality of solder balls and an underfill layer. The improved bond strength results from the provision of a roughened surface on the printed circuit board such that a larger surface area is available for bonding of the printed circuit board to the underfill layer. The roughened surface may further be provided on the interposer when such is utilized inbetween an IC chip and a printed circuit board when bonding an IC chip with high density bond pads and a printed circuit board with low density interconnections. The surface roughness may further provide a mechanical interlocking effect between the roughened surface of either a printed circuit board or an interposer with the underfill layer.

The roughened surface compensates for the CTE mismatch between the underfill material and the material for the printed circuit board or the interposer. Since the CTE for the printed circuit board or the interposer material is at least twice that of the underfill layer, thermal stress or strain is a major cause of failure resulting in fracture of the solder balls from either the bond pads on the IC chip or the conductive traces on the printed circuit board or the interposer. The underfill layer provides a buffer action for the thermal stress produced, while the roughened surface for the printed circuit board or the interposer further improves the adhesion and alleviate such thermal stress.

The surface roughness provided on the PCB or the interposer should be sufficiently great so that the bond strength between the underfill layer and the PCB or interposer can be improved by at least 10%, and preferably by at least 20%. The surface roughness should be provided not to interfere with the electrical conductors provided on the surface of the PCB or the interposer. Numerous methods may be utilized to provide such surface roughness, for instance, a chemical etching method or a mechanical abrasion method can be suitably used among other techniques. A chemical etching method may be used to produce recesses or dimples in the surface layer of a PCB or an interposer. The depth of the recesses or dimples should be such that a mechanical interlocking between the underfill material and the surface of the PCB or interposer is produced. Alternatively, a multiplicity of surface grooves may be formed by a mechanical abrasion method which produces a similar desirable result. The depth of the grooves should also be such that a mechanical interlocking between the underfill layer and the surface of the PCB or interposer is produced. Since the PCB or the interposer is frequently formed of a polymeric base material such as a standard diglycidyl ether of bisphenol-A epoxy, the chemical etching or the mechanical abrasion of such surface can be readily performed and precisely controlled. The improved adhesion between the underfill layer and the surface of the PCB or interposer greatly reduces the occurrence of fracture or otherwise separation between the IC chip and the PCB or interposer.

Referring initially to FIG. 1, wherein an enlarged, cross-sectional view of a present invention integrated circuit chip package 10 is shown. In the IC chip package 10, an IC die or chip 12 is bonded to a printed circuit board 14 by a plurality of solder balls 20 and an underfill layer 24 formed of an underfill material. A suitable underfill material may be one of silica filled epoxy material. The plurality of solder balls 20 may be formed by a solder bumping process utilizing a 95 Pb/5 Sn solder alloy on I/O bond pads (not shown) formed of suitable metallurgy on the surface 16 of the IC chip 12. In a typical solder ball bonding process shown in FIG. 1, corresponding sites on the organic substrate of the PCB board 14 may be finished with an eutectic solder of 63 Sn/37 Pb composition. After the IC chip 12, or the flip chip is aligned and placed on the substrate of the PC board 14 with the active surface 16 facing downward, the package is sent through a solder reflow furnace for a reflow process. During the reflow process, the low temperature solder alloy on the PC board 14 reflows and wets around the high temperature solder bumps formed on the active surface 16 of the IC die 12 to form interconnect between the die 12 and the PCB board 14. The high temperature solder balls 20 on the die surface 16 does not reflow and therefore maintains the chip standoff, i.e., a proper distance between the IC die 12 and the PCB board 14.

The top surface 18 of the PCB board 14, as shown in a preferred embodiment of the present invention in FIG. 1 is provided with a multiplicity of recesses 30. The recesses provides a desirable surface roughness for the PCB board 14 and thus improving its adhesion with the underfill layer 24. Such improvement in the bond strength partially offsets the thermal stress and strain produced between the underfill layer 24 and the PCB board 14 based on a CTE mismatch. The multiplicity of recesses 30 formed in the surface 18 of the PCB board 14 should have a depth that is sufficiently large so that a mechanical interlocking effect is formed between the underfill layer 24 and the surface 18 of the PCB board. The interlocking effect helps to prevent a delamination or separation of the underfill layer 24 from the surface 18 of the PCB board due to thermal stress or strain produced in a subsequent thermal cycling.

Figure 2:
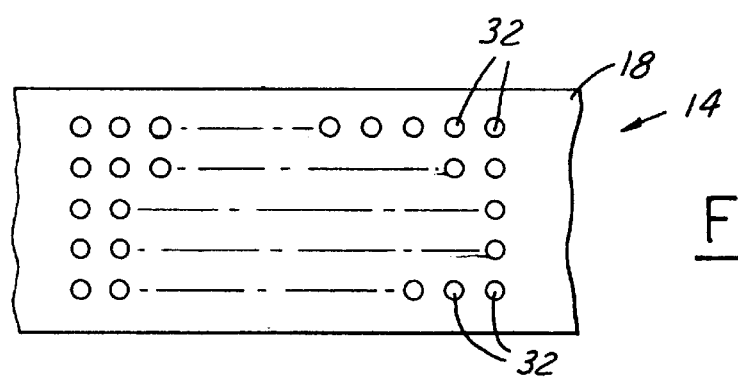
FIG. 2 is a plane view of a top surface of the printed circuit board of FIG. 1 illustrating the multiplicity of dimples.

The multiplicity of recesses 30 may be formed in various forms by various methods. One of such form, i.e., dimples, is shown in FIG. 2. An enlarged, plane view of the surface 18 of the printed circuit board 14 is shown in FIG. 2 which is equipped with a multiplicity of dimples 32. The depth of the dimples should be sufficiently large such that a mechanical interlocking effect is accomplished with the underfill material adhered thereto. The diameter and the density of the dimples may be suitably selected in each specific application to achieve a desirable result of improvement in bond strength. A desirable improvement in the bond strength between the underfill layer 24 and the surface 18 of the PCB board 14 is at least 10%, and preferably at least 20% over the bond strength achieved with a PCB board that has a smooth surface. A suitable method for producing such dimples 32 can be a chemical etching method. Since the material used for the PCB board 14 is frequently a polymeric based material, the selection of a suitable etchant for such surface is readily available. The chemical etching may be conducted by using a mask that has the desired pattern for the dimples having a suitable diameter and spacing between them.

Figure 3:
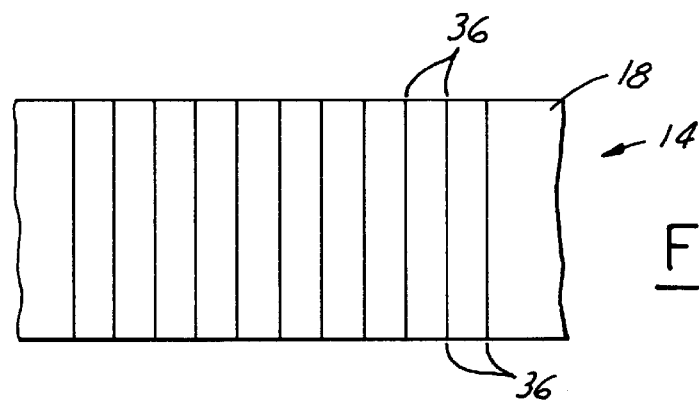
FIG. 3 is a plane view of a top surface of the printed circuit board of FIG. 1 illustrating a surface roughness formed by a multiplicity of grooves.

In another preferred embodiment of the present invention method, as shown in FIG. 3, surface grooves 36 are formed in the surface 18 of the PCB board 14. The multiplicity of surface grooves 36 can be formed of a suitable width and depth for each groove such that a desirable mechanical interlocking effect is achieved between a subsequently coated underfill material and the surface 18 of the PCB. Similarly, the improvement in the bond strength between the underfill layer 24 and the PCB 14 should be at least 10%, and preferably at least 20%. A suitable spacing between the surface grooves 36 may also be selected for each particular application and the improvement in the bond strength desired. It should be noted that the surface grooves 36, or the dimples 32 should be provided without interfering or damaging the electrical conductors on the surface 18 of the PCB 14. Such electrical conductors are normally formed as electrical traces by a conductive metal. A suitable method for forming the surface grooves 36 may be a mechanical abrasion method, or a chemical etching method.

Figure 4:
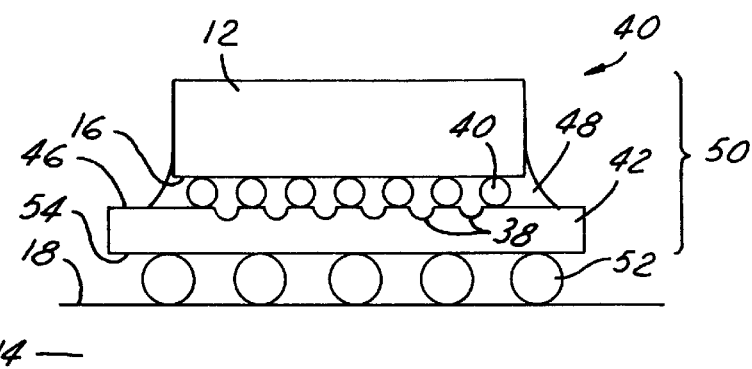
FIG. 4 is an enlarged, cross-sectional view of a present invention integrated circuit package wherein an IC chip is first bonded to an interposer by the present invention method, the interposer is then bonded to a printed circuit board by a plurality of solder balls.

The present invention novel method may further be utilized in an IC chip package when the use of an interposer is necessary. This is shown in FIG. 4. The IC package 40 is formed by first bonding an IC chip 12 to an interposer 42, and then subsequently bonding the interposer 42 to the PCB 14. The use of the interposer 42 is necessary when an IC die 12 is equipped with high density bond pads. In other words, the bond pads (not shown) on the surface 16 of the IC die 12 has a smaller pitch than the bonding sites (not shown) on the surface 18 of the PCB 14. The interposer 42 therefore provides a transition between a small-pitched IC die and a large-pitched PCB. The interposer 42 is not necessary when a high density PCB is used wherein the pitch matches that on the IC die. After the IC die 12 is first bonded to the interposer 42 by a plurality of solder balls 44, an interposer material 48 is filled into the gap formed between the solder balls 44, the active surface 16 of the IC die 12 and the top surface 46 of the interposer 42. The underfill material may be selected of any suitable material. One of such suitable materials is a silica fill epoxy which has the least CTE mismatch problem with the interposer 42.

The IC die 12/interposer 42 assembly 50 is then bonded to the PCB 14 by a second plurality of solder balls 52. The bonding is formed between bonding sites (not shown) on the surface 54 of the interposer 42 and the bonding sites (not shown) on the top surface 18 of the PCB 14. The pitch between the corresponding bonding sites are the same such that a proper transition from the IC die 12 to the PCB 14 is accomplished.

In the present invention novel method, the surface 46 of the interposer 42 is provided with a multiplicity of recesses 38 for improving a bond strength formed between the underfill layer 48 and the top surface 46 of the interposer 42. The multiplicity of recesses 38 should be formed with a suitable shape and depth such that a mechanical interlocking effect is achieved between the underfill material 48 and the interposer 42. The depth and shape of the recesses 38 should be such that the bond strength is improved by at least 10%, and preferably by at least 20% between the underfill material 48 and the top surface 46 of the interposer 42.

The multiplicity of recesses 38 shown in FIG. 4 can be formed by methods similar in forming the recesses 30 in the first preferred embodiment of FIG. 1. Either a multiplicity of dimples or a multiplicity of surface grooves may be utilized to achieve the bond strength improvement. Such recesses can be formed by either a chemical etching or a mechanical abrasion method as previously described.

The present invention novel apparatus and method have therefore been amply demonstrated in the above descriptions and in the appended drawings of FIGS. 1–4. It should be noted that while the present invention novel method has been demonstrated in a bonding process between an IC die and a PCB or an interposer by utilizing a roughened surface on the later, the application of the present invention novel method is in no way restricted only to such applications. Any other bonding process between two surfaces in an integrated circuit chip package may similarly utilize the present invention novel method for achieving improved bond strength between the components.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. An integrated circuit (IC) package comprising:
    an IC chip having a first surface provided with a first plurality of bond pads,
    a substrate having a second surface provided with a first plurality of electrical conductors for bonding to said first plurality of bond pads on said IC chip by a first plurality of spaced-apart solder balls, and
    an underfill for filling gaps between said first plurality of spaced-apart solder balls, said first surface and said second surface, wherein said second surface on said substrate having a surface roughness contacting said solder balls and is sufficiently great for increasing the bond strength between said first surface, said second surface and said underfill from a value obtained on said second surface without said surface roughness.

2. An integrated circuit package according to claim 1, wherein said surface roughness on said second surface being sufficiently great so as to increase the bond strength between said first surface and said second surface by at least 10%.

3. An integrated circuit package according to claim 1, wherein said substrate is a printed circuit board (PCB).

4. An integrated circuit package according to claim 1, wherein said substrate is an interposer.

5. An integrated circuit package according to claim 1, wherein said first plurality of electrical conductors are traces formed by a conductive metal.

6. An integrated circuit package according to claim 1 further comprising:
    an interposer used for said substrate,
    a printed circuit board having a second plurality of electrical conductors on a third surface,
    a second plurality of spaced-apart solder balls for providing electrical communication between said interposer and said second plurality of electrical conductors, and
    an underfill filling gaps formed between said second plurality of spaced-apart solder balls, said interposer and said third surface on said printed circuit board.

7. An integrated circuit package according to claim 1, wherein said surface roughness is provided by a multiplicity of recesses formed in said second surface.

8. An integrated circuit package according to claim 7, wherein said multiplicity of recesses each having a depth sufficiently large such that a mechanical interlocking is achieved between said multiplicity of recesses, said interposer and said second surface.

9. An integrated circuit package according to claim 7, wherein said multiplicity of recesses is a multiplicity of dimples.

10. An integrated circuit package according to claim 1, wherein said surface roughness is provided by a multiplicity of grooves formed in said second surface.

11. An integrated circuit package comprising:
    an IC chip having a first surface provided with a first plurality of bond pads,
    an interposer having a second surface provided with a first plurality of electrical conductors,
    a first plurality of spaced-apart solder balls for electrically connecting said first plurality of bond pads to said first plurality of electrical conductors,
    an underfill layer for filling gaps between said first plurality of spaced-apart solder balls, said first surface and said second surface,
    a printed circuit board having a second plurality of electrical conductors formed on a third surface, and
    a second plurality of spaced-apart solder balls electrically connecting said interposer to said second plurality of electrical conductors on said printed circuit board,
    wherein said second surface on said interposer is provided with a surface roughness contacting said solder balls and is sufficiently great to increase the bond strength between said first surface, said second surface and said underfill layer from a value obtained on said second surface without said surface roughness.

12. An integrated circuit package according to claim 11, wherein said surface roughness is sufficiently great for increasing the bond strength between said first surface and said second surface by at least 10%.

13. An integrated circuit package according to claim 11, wherein said surface roughness is formed by a multiplicity of recesses in said second surface.

14. An integrated circuit package according to claim 13, wherein said multiplicity of recesses is a multiplicity of dimples.

15. An integrated circuit package according to claim 13, wherein said multiplicity of recesses is a multiplicity of grooves.

16. An integrated circuit package according to claim 11, wherein said first plurality and said second plurality of electrical conductors are traces formed by a conductive metal.

17. An integrated circuit package according to claim 11, wherein said surface roughness is formed by a chemical etching process or by a mechanical abrasion process.

\* \* \* \* \*